United States Patent
Cheng

(10) Patent No.: US 8,248,786 B2
(45) Date of Patent: Aug. 21, 2012

(54) HEAT SINK TYPE MODULE

(75) Inventor: Hao-Der Cheng, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 104 days.

(21) Appl. No.: 12/840,456

(22) Filed: Jul. 21, 2010

(65) Prior Publication Data
US 2011/0267771 A1    Nov. 3, 2011

(30) Foreign Application Priority Data
Apr. 30, 2010 (TW) ................... 99113955 A

(51) Int. Cl.
*H05K 7/20* (2006.01)
(52) U.S. Cl. ........... 361/679.54; 361/704; 361/710; 361/707; 361/719; 165/80.3; 165/104.33; 165/185; 257/717; 257/719; 174/16.3
(58) Field of Classification Search ........... 361/679.46–679.54, 688, 689, 361/690–697, 700–722, 732, 737, 740–742, 361/752–759, 800, 818; 165/80.2, 80.3, 165/80.4, 80.5, 104.33, 104.34, 185; 174/15.1, 174/16.3, 252; 257/706–727; 24/453, 457, 24/458, 473, 527; 411/508, 511, 518, 519, 411/913; 29/739, 741, 743, 832, 840
See application file for complete search history.

(56) References Cited

U.S. PATENT DOCUMENTS

| | | | | |
|---|---|---|---|---|
| 6,707,674 B1 * | 3/2004 | Bryant et al. | ................. | 361/704 |
| 6,952,348 B2 * | 10/2005 | Wu | ................. | 361/719 |
| 6,958,915 B2 * | 10/2005 | Wang et al. | ................. | 361/709 |
| 7,193,853 B2 * | 3/2007 | Chen et al. | ................. | 361/719 |
| 7,280,362 B2 * | 10/2007 | Hood et al. | ................. | 361/719 |
| 7,567,439 B2 * | 7/2009 | Li et al. | ................. | 361/710 |

FOREIGN PATENT DOCUMENTS
JP    408264689 A  * 10/1996
* cited by examiner

*Primary Examiner* — Michail V Datskovskiy
(74) *Attorney, Agent, or Firm* — Altis Law Group, Inc.

(57) ABSTRACT

A heat sink type module includes a mounting seat and a heat sink. The mounting seat includes a supporting plate, and two substantially parallel first side plates extending up from opposite first sides of the supporting plate. A latch protrudes from an inner surface of each first side plate. A heat sink includes a base plate and fins extending up from a top surface of the base plate. The base plate includes two substantially parallel first sides. The latches of the first side plates latch the first sides of the base plate to fix the heat sink.

8 Claims, 6 Drawing Sheets

HEAT SINK TYPE MODULE

BACKGROUND

1. Technical Field

The present disclosure relates to a heat sink type module.

2. Description of Related Art

A typical heat sink type module installed on a motherboard includes a heat sink, a mounting seat, and a latching member. The heat sink is attached to the mounting seat by the latching member, and the mounting seat is installed on the motherboard by screws, which is inconvenient. Moreover, the structure of the heat sink type module is extremely complex.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
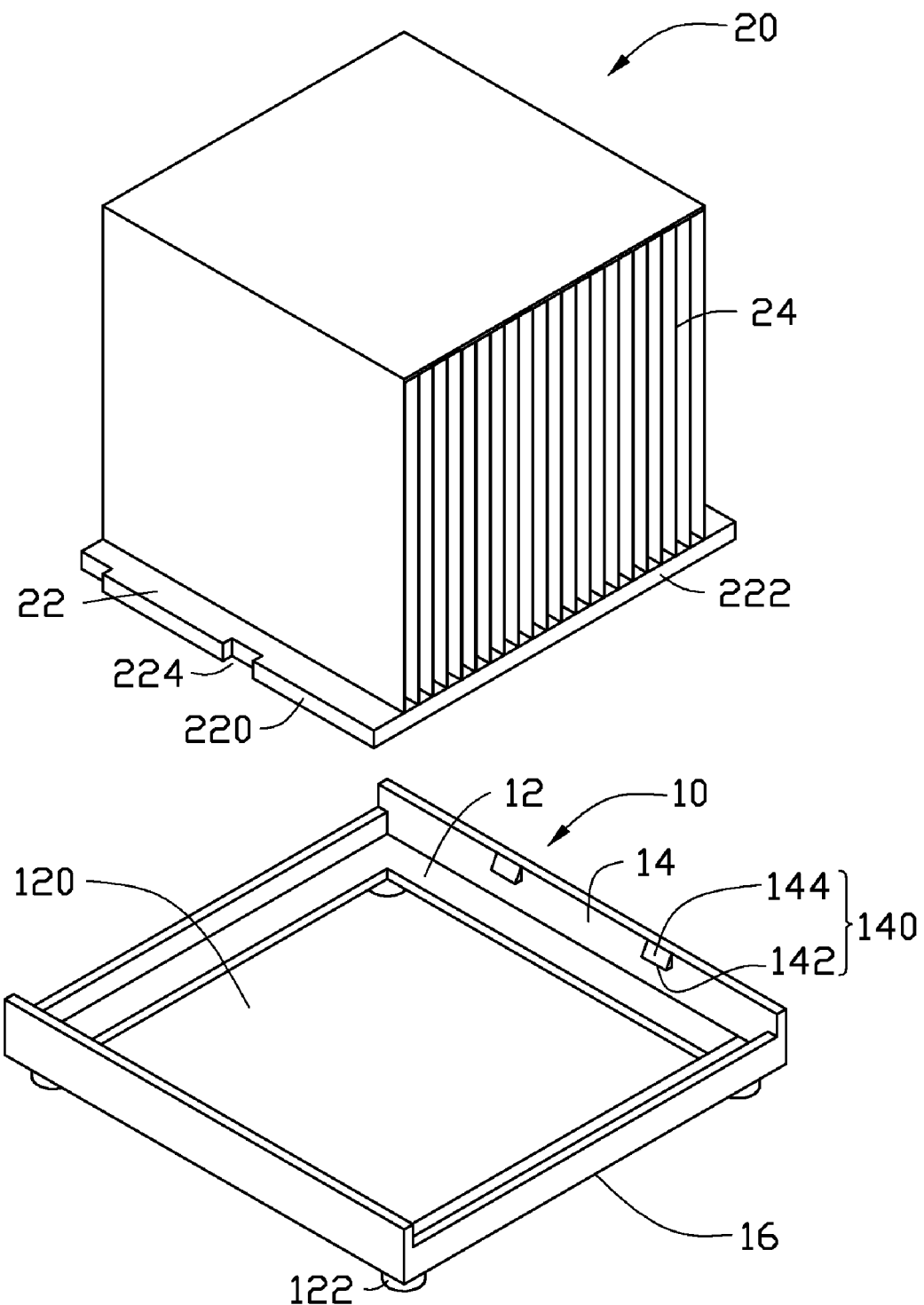
FIG. 1 is an exploded, isometric view of one embodiment of a heat sink type module.

Referring to FIG. 1, one embodiment of a heat sink type module includes a mounting seat 10 and a heat sink 20.

The mounting seat 10 includes a square supporting plate 12, two substantially parallel first side plates 14 extending up from opposite first sides of the supporting plate 12, and two substantially parallel second side plates 16 extending up from opposite second sides of the supporting plate 12. The first side plates 14 extend higher than the second side plates 16. The first side plates 14 are connected between the second side plates 16 to cooperatively form a frame. The supporting plate 12 defines an opening 120. Four mounting posts 122 extend down from four corners of a bottom surface of the supporting plate 12.

Two wedge-shaped latches 140 protrude from an inner surface of each first side plate 14. Each latch 140 includes a stopping surface 142 at the bottom of the latch and substantially perpendicularly to the first side plate 14, and a guiding surface 144 slantingly connected between the stopping surface 142 and the corresponding first side plate 14. The stopping surfaces 142 of all the latches 140 are at the same height from the supporting plate 12.

The heat sink 20 includes a square base plate 22 and a plurality of fins 24 extending up from a top surface of the base plate 22. A protrusion 26 (shown in FIG. 2) protrudes down from a center portion of a bottom of the base plate 22. The base plate 22 includes two substantially parallel first sides 220 and two substantially parallel second sides 222 connected between and substantially perpendicular to the first sides 220. Each first side 220 defines two notches 224.

Figure 2:
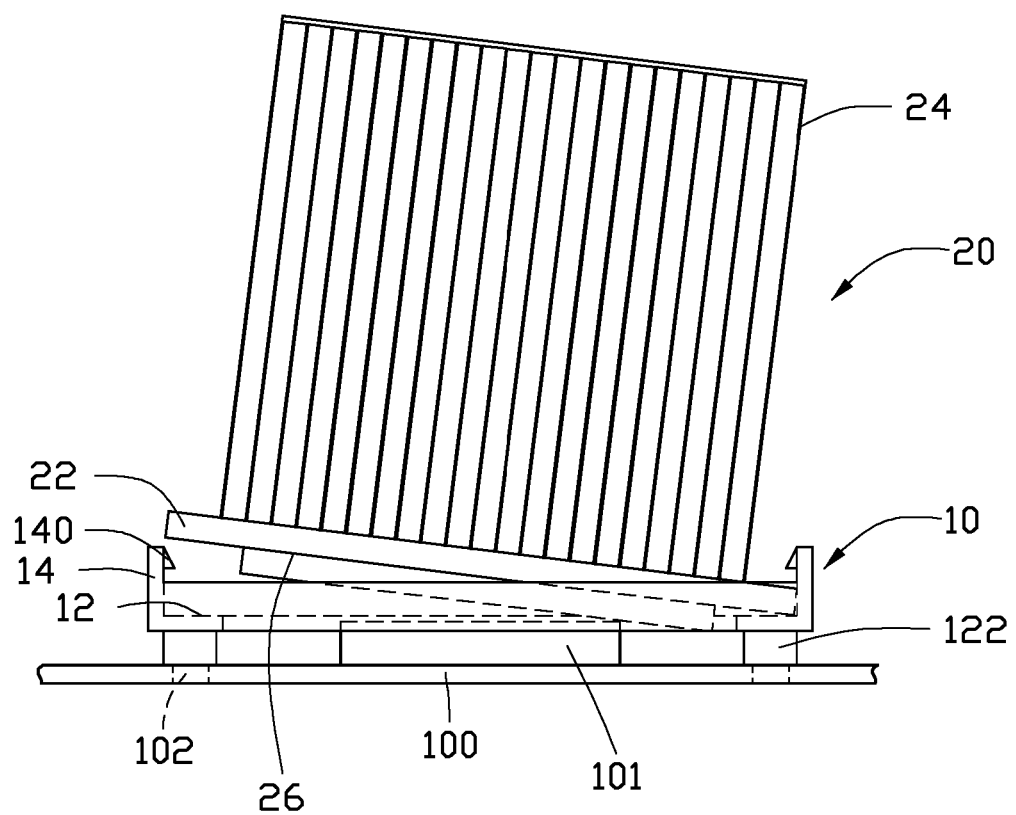
FIG. 2 is a side planar view showing a process of installing the heat sink type module.
Figure 3:
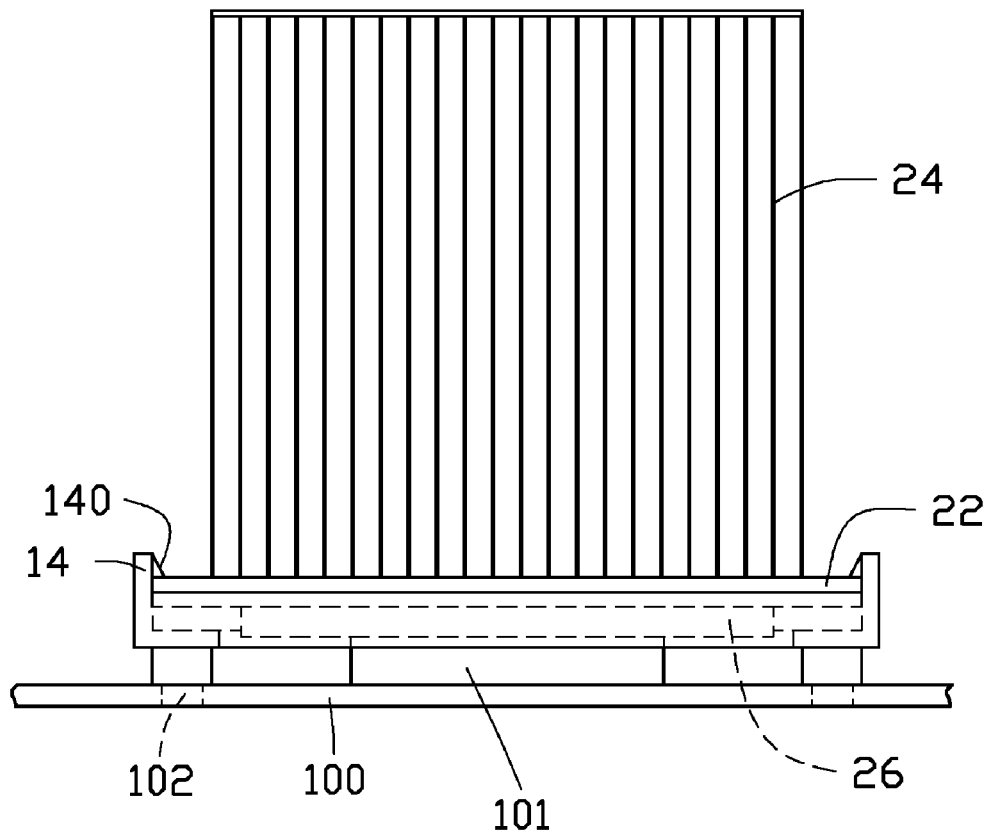
FIG. 3 is an assembled, side planar view of the heat sink type module of FIG. 1.
Figure 4:
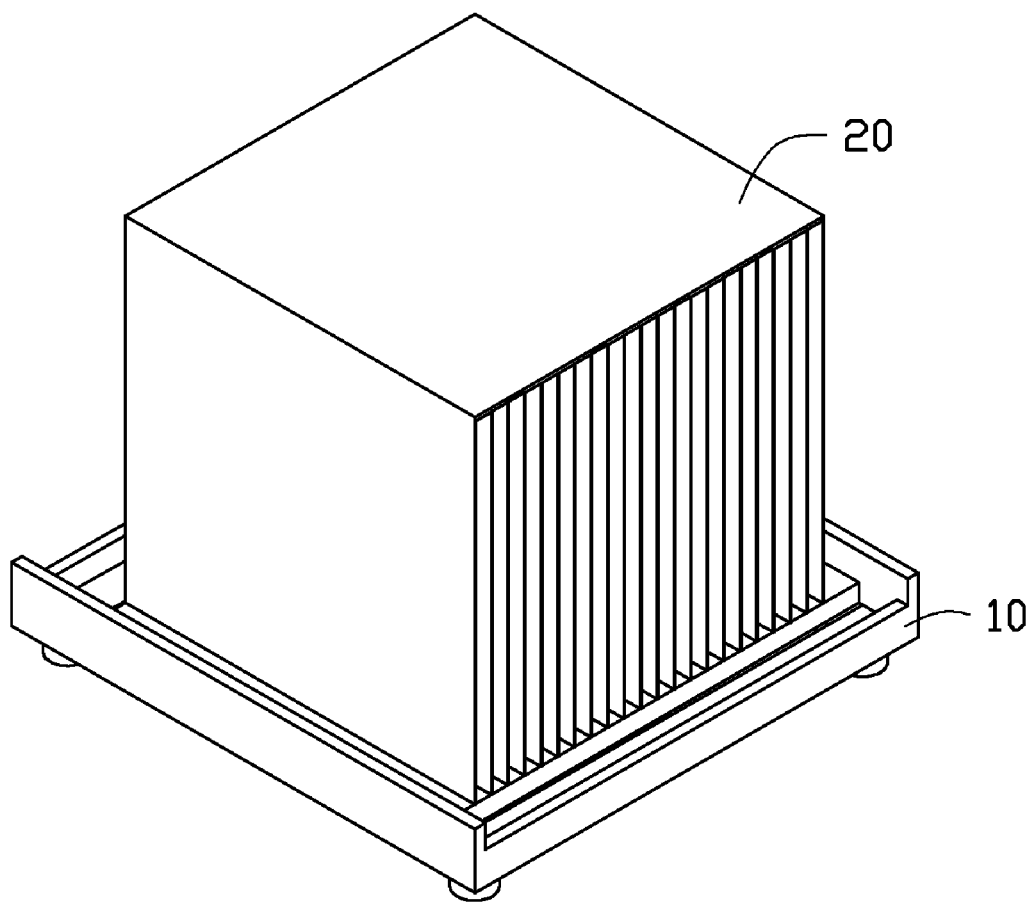
FIG. 4 is an assembled, isometric view of the heat sink type module of FIG. 1.

Referring to FIGS. 2 to 4, in assembly, the mounting seat 10 is placed on a heating element 101 of a motherboard 100. The mounting posts 122 are attached by mounting holes 102 of the motherboard 100. In this embodiment, the heating element 101 is a central processing unit. The protrusion 26 of the heat sink 20 is coated with a cooling silica gel. One first side 220 of the heat sink 20 resists against the stopping surfaces 142 of one first side plate 14 of the mounting seat 10. The other first side 220 slides into the mounting seat 20 along the guiding surfaces 144 of the other first side plate 14. The first sides 220 resist against the stopping surfaces 142 of the first side plates 14, to fix the heat sink 20 in the mounting seat 10. The protrusion 26 aligns with and resists against the heating element 101 through the opening 120.

Figure 5:
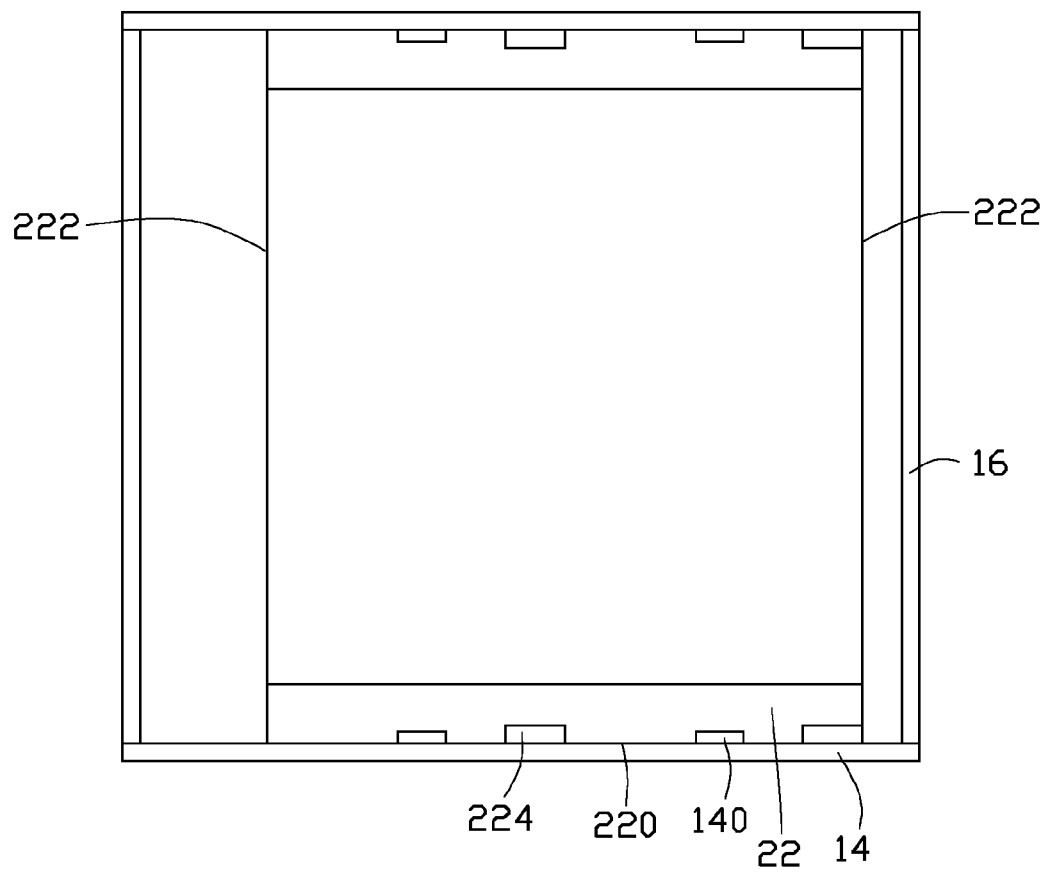
FIG. 5 is a top planar view of FIG. 4.

Referring to FIG. 5, the notches 224 are apart from the latches 140. The second sides 222 are apart from the second side plates 16. The second side plates 16 are lower than the first side plates 14, which allows for ventilation.

In other embodiments, each notch 224 of the heat sink 20 aligns with a corresponding one of the latches 140, then the base plate 22 of the heat sink 20 is placed in the mounting seat 10. The heat sink 20 is moved in a longitudinal direction of the second sides 222, to make each notch 224 apart from the corresponding latch 140. Thus, the first sides 220 resist against the stopping surfaces 142 of the first side plates 14.

Figure 6:
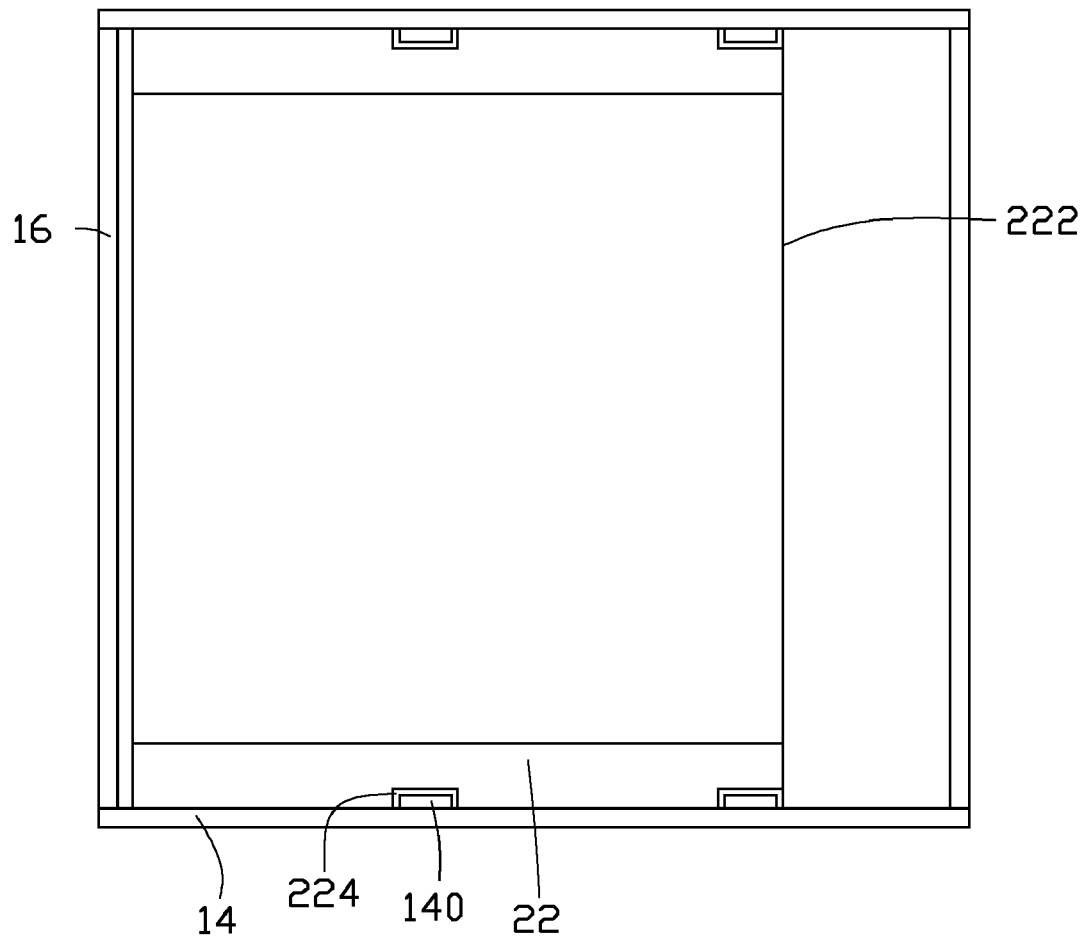
FIG. 6 is similar to FIG. 5, but showing a different state.

Referring to FIGS. 5 and 6, in disassembling the heat sink 20, the heat sink 20 is moved in a longitudinal direction of the second sides 222 to align each notch 224 of the heat sink 20 with the corresponding latch 140. The heat sink 20 is pulled up in a direction away from the base plate 22, so that the latches 140 pass through the notches 224. The heat sink 20 is separated away from the mounting seat 10.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat sink type module comprising:
   a mounting seat comprising two substantially parallel first side plates, and at least one latch protruding from an inner surface of each first side plate; and
   a heat sink comprising a base plate and a plurality of fins extending up from a top surface of the base plate, the base plate comprising two substantially parallel first sides, each first side defining at least one notch through which the at least one latch passes;
   wherein the at least one latch of each first side plate latches corresponding first sides of the base plate to fix the heat sink, when the base plate is moved to align the notches of the heat sink with the corresponding latch, the latches can pass through the notches to separate the heat sink away from the mounting seat.

2. The heat sink type module of claim 1, wherein the mounting seat further comprises a supporting plate, the first side plates extending up from opposite first sides of the supporting plate.

3. The heat sink type module of claim 2, wherein the supporting plate defines an opening, and a protrusion protrudes down from a bottom of the base plate and passes through the opening of the supporting plate to resist against a heating element of a motherboard.

4. The heat sink type module of claim 1, wherein two latches protrude from the inner surface of each first side plate, and each first side of the base plate defines two notches through which the latches of the corresponding first side plate pass.

5. The heat sink type module of claim 2, wherein the mounting seat further comprises two substantially parallel second side plates extending up from opposite second sides of the supporting plate, and the base plate further comprises two substantially parallel second sides between and apart from the second side plates.

6. The heat sink type module of claim 5, wherein the second side plates are lower than the first side plates.

7. The heat sink type module of claim 1, wherein each latch is wedge-shaped and comprises a stopping surface substantially perpendicular to a corresponding first side plate, and a guiding surface slantingly connected between the stopping surface and the corresponding first side plate.

8. The heat sink type module of claim 2, wherein a plurality of mounting posts extend down from a bottom surface of the supporting plate to fix the mounting seat on a motherboard.

\* \* \* \* \*